United States Patent
Hung et al.

(10) Patent No.: US 7,649,772 B2
(45) Date of Patent: Jan. 19, 2010

(54) MEMORY AND METHOD FOR PROGRAMMING IN MULTIPLE STORAGE REGION MULTI-LEVEL CELLS

(75) Inventors: Chun-Hsiung Hung, Hsinchu (TW); Hsin-Yi Ho, Hsinchu (TW); Wen-Chiao Ho, Tainan County (TW)

(73) Assignee: Macronix International Co., Ltd., Hsinchu (TW)

( * ) Notice: Subject to any disclaimer, the term of this patent is extended or adjusted under 35 U.S.C. 154(b) by 291 days.

(21) Appl. No.: 11/779,951

(22) Filed: Jul. 19, 2007

(65) Prior Publication Data

US 2009/0021994 A1     Jan. 22, 2009

(51) Int. Cl.
G11C 11/34 (2006.01)
G11C 16/04 (2006.01)

(52) U.S. Cl. .............. 365/185.03; 365/185.12; 365/189.16

(58) Field of Classification Search ............ 365/185.02, 365/185.03 O, 185.12 X, 189.16 X, 185.03, 365/185.12, 189.16

See application file for complete search history.

(56) References Cited

U.S. PATENT DOCUMENTS

| 7,085,168 | B2 * | 8/2006 | Lee et al. | 365/185.24 |
| 7,206,225 | B2 * | 4/2007 | Wu | 365/185.03 |
| 7,324,374 | B2 * | 1/2008 | Shieh et al. | 365/185.03 |
| 7,385,844 | B2 * | 6/2008 | Yano et al. | 365/185.03 |

* cited by examiner

*Primary Examiner*—VanThu Nguyen
(74) *Attorney, Agent, or Firm*—Thomas, Kayden, Horstemeyer & Risley

(57) ABSTRACT

A method for programming a memory, which includes multiple multi-level cells each having a left half cell and a right half cell, includes the following steps. First, a target address corresponding to 2n-group data to be stored is provided, wherein n is a positive integer. Next, the 2n-group data is sequentially programmed into the multi-level cells based upon the target address in a programming loop so that the data stored in the left half cells and the data stored in the right half cells are from different groups of the 2n-group data.

9 Claims, 4 Drawing Sheets

MEMORY AND METHOD FOR PROGRAMMING IN MULTIPLE STORAGE REGION MULTI-LEVEL CELLS

BACKGROUND OF THE INVENTION

1. Field of the Invention

The invention relates in general to a memory and a method for programming the same, and more particularly to a memory with the shortened memory programming time and a method for programming the same.

2. Description of the Related Art

At present, memories may be used in various occasions for storing data. The memories may be classified into various types including, for example, a multi-level cell (MLC) memory. FIG. 1A (Prior Art) is a schematic illustration showing a conventional multi-level cell 100. Referring to FIG. 1A, the multi-level cell 100 includes a left half cell 110 and a right half cell 120. Each of the half cells of the multi-level cell 100 may have many bits according to the threshold voltage distribution.

Description will be made by taking each half cell having two bits as an example. FIG. 1B (Prior Art) shows the distribution of threshold voltages of the multi-level cell 100. As shown in FIG. 1B, the threshold voltage distributions of the left half cell 110 and the right half cell 120 are sequentially defined as (11, 10, 01, 00). The threshold voltage distributions in FIG. 1B have to be possibly gathered together so that the sufficient read window can be kept to prevent the threshold voltage of the right half cell 120 from influencing the threshold voltage of the left half cell 110, and thus to prevent the error from occurring when the half cells are being read.

To solve the above-mentioned problems, the left half cell 110 and the right half cell 120 have to be programmed in the single programming loop. In the conventional programming command, each bit data has a corresponding address. When 4-bit data is to-be-programmed into the multi-level cell 100, the programming command must include at least four sets of addresses and data. Consequently, the complexity of the programming command received by the memory increases, and the programming flow of the memory becomes complicated and time-consuming.

SUMMARY OF THE INVENTION

The invention is directed to a memory and a method for programming the same using a new programming flow to reduce the complicated address inputs received by the memory and thus to shorten the memory programming time.

According to a first aspect of the present invention, a method for programming a memory is provided. The memory includes multiple multi-level cells each having a left half cell and a right half cell. The method includes the steps of: providing a target address which corresponds to 2n-group data to be stored, wherein n is a positive integer; and programming the 2n-group data into the multi-level cells sequentially based upon the target address in a programming loop so that the data stored in the left half cells and the data stored in the right half cells are from different groups of the 2n-group data. The 2n-group can be 2n-page for example.

According to a second aspect of the present invention, a memory including multiple memory cell blocks, each including multiple bit lines, multiple word lines and multiple multi-level cells is provided. The multi-level cells are respectively coupled to the bit lines and the word lines. Each of the multi-level cells includes a left half cell and a right half cell. 2n-group data to be stored is sequentially programmed into the multi-level cells based upon a target address in a programming loop so that the data stored in the left half cells and the data stored in the right half cells are from different groups of the 2n-group data, n is a positive integer.

The invention will become apparent from the following detailed description of the preferred but non-limiting embodiments. The following description is made with reference to the accompanying drawings.

DETAILED DESCRIPTION OF THE INVENTION

The invention relates to a memory and a method for programming the memory using a new programming flow to reduce the complicated address inputs received by the memory and thus to shorten the memory programming time.

Figure 1A:
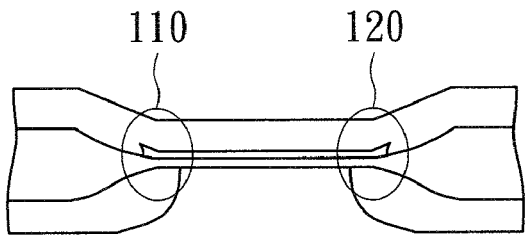
FIG. 1A (Prior Art) is a schematic illustration showing a conventional multi-level cell.
Figure 1B:
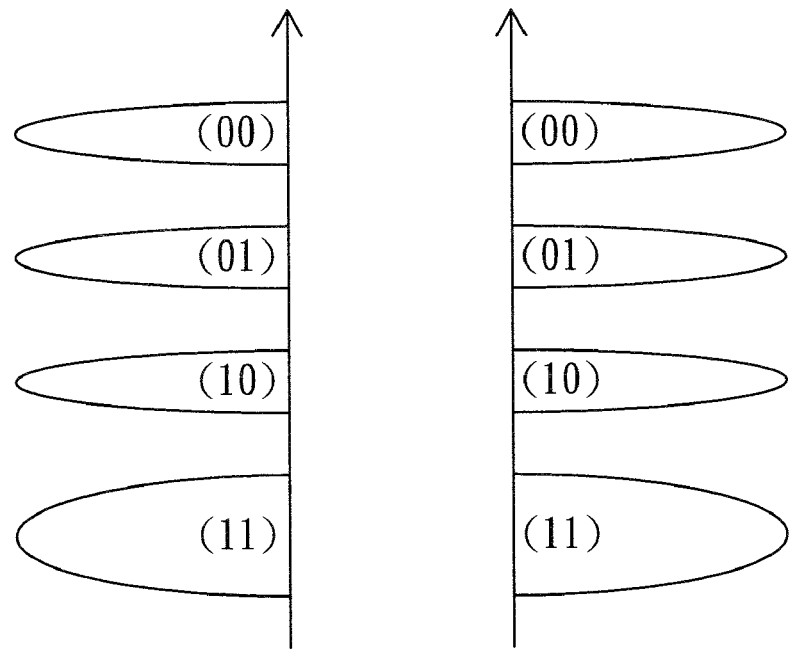
FIG. 1B (Prior Art) shows the distribution of threshold voltages of the multi-level cell 100.
Figure 2:
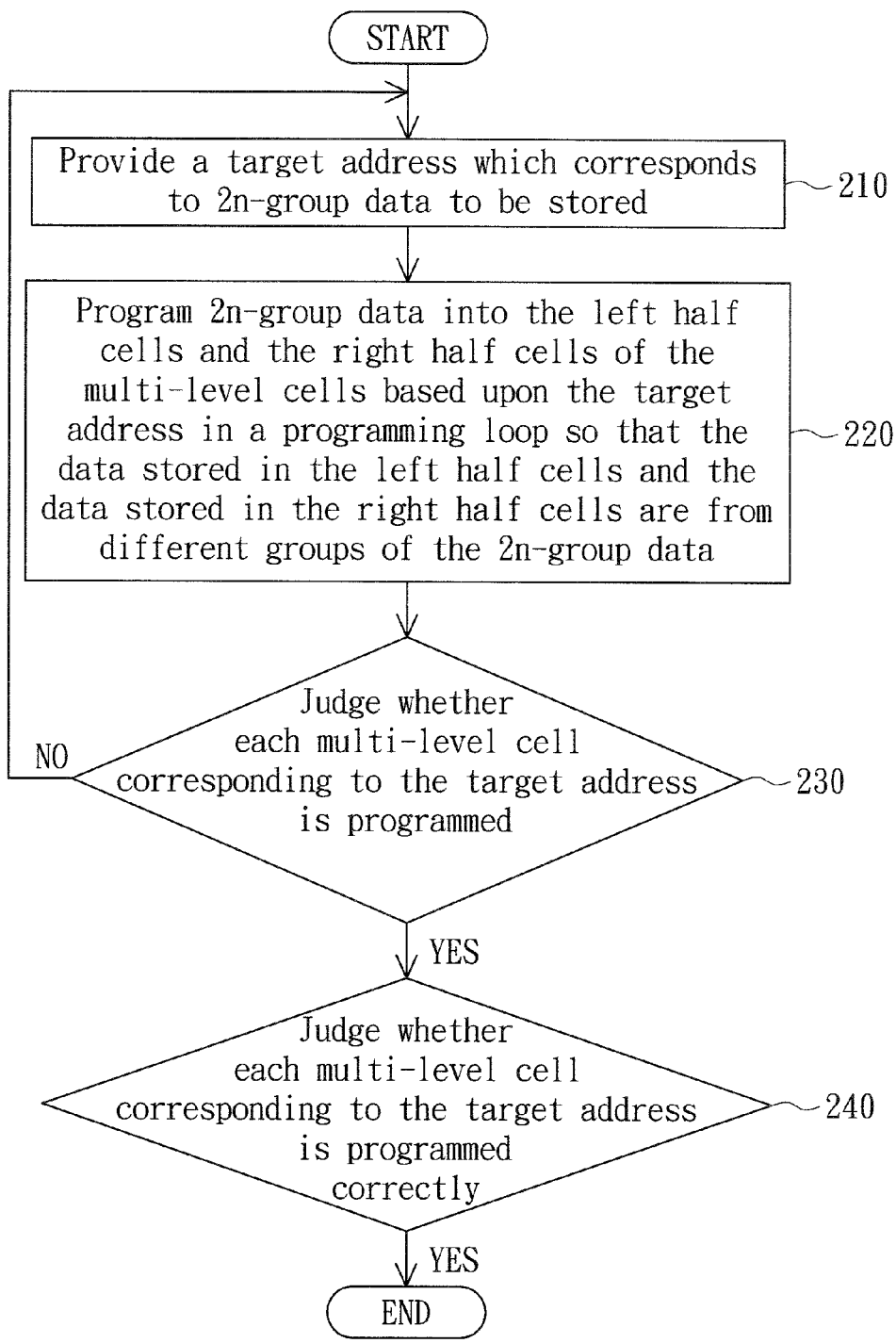
FIG. 2 is a flow chart showing a method for programming a memory according to a preferred embodiment of the invention.

FIG. 2 is a flow chart showing a method for programming a memory according to a preferred embodiment of the invention. As shown in FIG. 2, the method for programming the memory of this embodiment is substantially applied to a multi-level cell memory, which includes multiple memory cell blocks, each including many multi-level cells. Each multi-level cell includes a left half cell and a right half cell. Each half cell may have n bits.

First, in step 210, a target address which corresponds to 2n-group data to be stored is provided, wherein n is a positive integer. 2n-bit data to be stored in each multi-level cell is from the different groups of the 2n-group data respectively. The target address and the 2n-group data are substantially a programming command with respect to the memory. The programming command may be, without limitation composed of multiple sets of target addresses and multiple 2n-group data. In addition, the target address corresponds, without limitation, to a first bit of the 2n-group data, and may also correspond to a last bit of the 2n-group data.

Next, in step 220, the 2n-group data is programmed into the left half cells and the right half cells of the multi-level cells based upon the target address in a programming loop so that the data stored in the left half cells and the data stored in the right half cells are from different groups of the 2n-group data. Each of the left half cells and the right half cells substantially stores n-bit data. The 2n-bit data of each multi-level cell corresponds to the 2n-group data received in step 210.

When the target address corresponds to the first bit of the 2n-group data, the left half cells of the target multi-level cells in the memory cell block are first programmed so that each of the left half cells stores a first bit. Then, each of the left half cells is first programmed to have the second bit to $n^{th}$ bit with respect to the other (2n−1) group data. Next, each of the right half cells of the multi-level cells in the target memory block is programmed to have the $(n+1)^{th}$ bit to the $2n^{th}$ bit.

Thereafter, in step 230, it is judged that whether each of the multi-level cells corresponding to the target address has been programmed. If not, the steps of receiving and programming are repeated. That is, the multi-level cells that are not programmed are programmed according to the programming command. In the actual memory architecture, the judging step 230 is performed by reading a first pin (I/O 6 or R/B̄). When the output of the first pin (I/O 6 or R/B̄) is "1", it represents that all the multi-level cells corresponding to the target address have been programmed.

Figure 3:
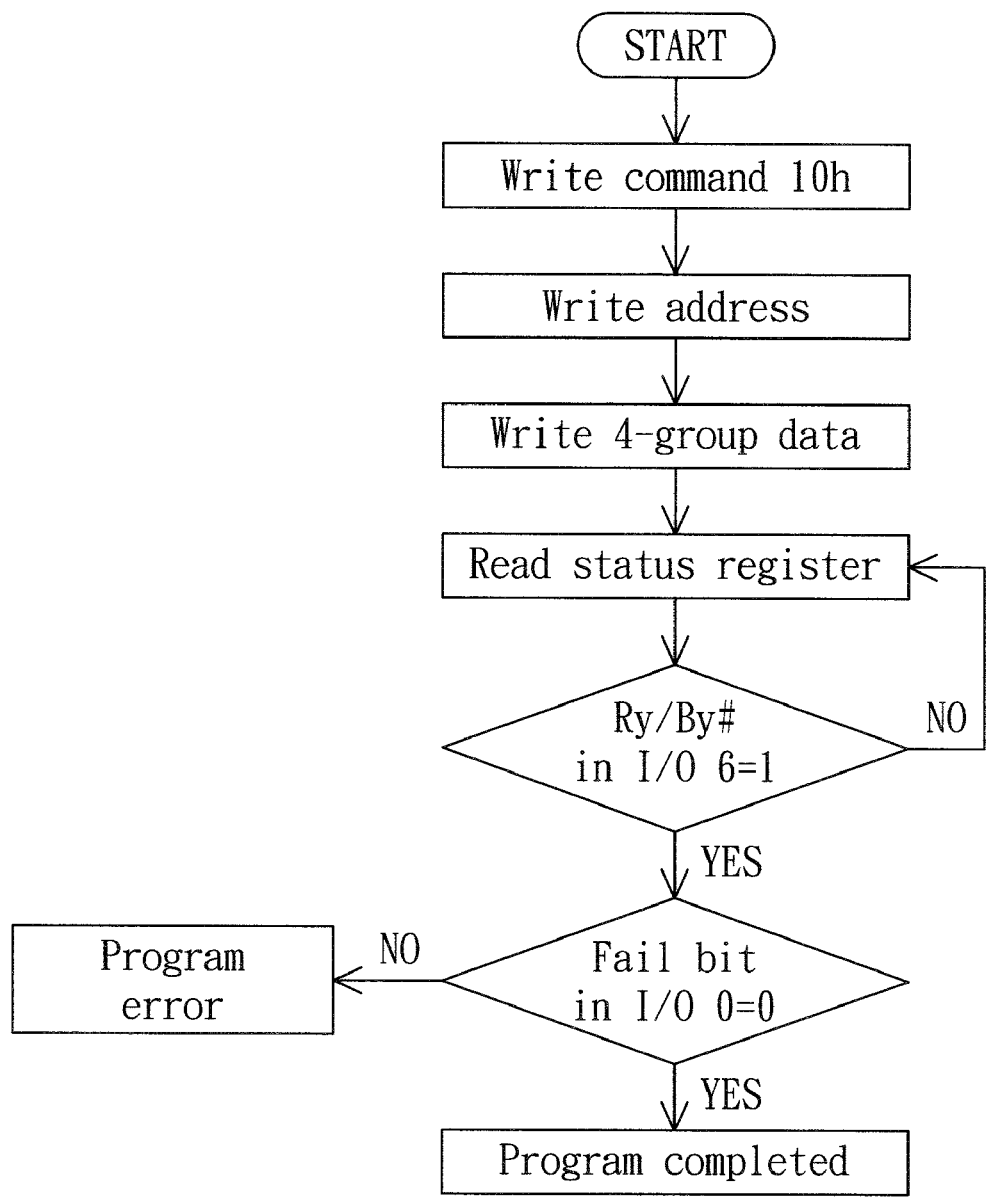
FIG. 3 is a flow chart showing an example of the method for programming a memory of the invention practically applied to a memory.

Then, in step 240, it is judged that whether each of the multi-level cells corresponding to the target address has been programmed correctly. If each multi-level cell has been correctly programmed, the memory programming method is terminated. In the actual memory architecture, the judging step 240 is performed by reading a second pin (I/O 0). When the output of the second pin (I/O 0) is "0", it represents that all multi-level cells corresponding to the target address have been correctly programmed. Referring to FIG. 3, a flow chart showing an example of the method for programming a memory of the invention practically applied to a memory is shown. The command 10h is used to notify the memory to make a programming operation. Next, the address is received and the corresponding multiple group data is programmed. Then the I/O 6 pin is checked to determine whether each multi-level cell of the memory cell block has been programmed. Afterwards, the I/O 0 pin is checked to determine whether each multi-level cell of the memory cell block has been programmed correctly.

Figure 4:
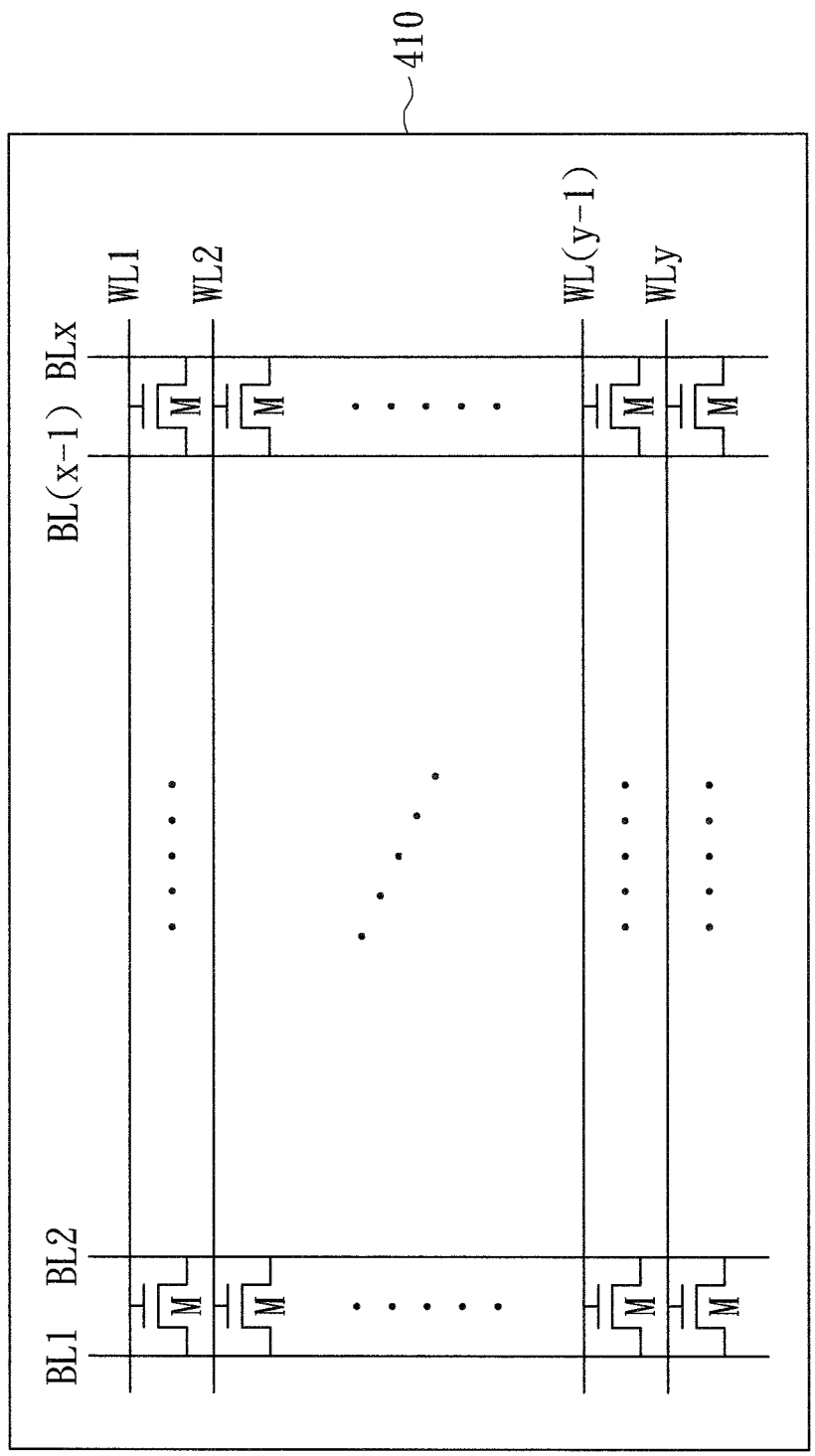
FIG. 4 is a schematic illustration showing the memory according to the preferred embodiment of the invention.

FIG. 4 is a schematic illustration showing the memory 400 according to the preferred embodiment of the invention. Referring to FIG. 4, the memory 400 includes multiple memory cell blocks, such as a memory cell block 410. The memory cell block 410 includes a plurality of bit lines BL1 to BLx, a plurality of word lines WL1 to WLy and a plurality of multi-level cells M, wherein x and y are positive integers. The multi-level cells M respectively correspond to the bit lines BL1 to BLx and the word lines WL1 to WLy. Each multi-level cell M includes a left half cell and a right half cell. Each half cell may have multiple bits. The operating principle of the memory 400 has been disclosed in the memory programming method mentioned hereinabove, so detailed descriptions thereof will be omitted.

The memory and the method for programming the same according to the embodiment of the invention utilize a new programming flow and a simplified programming command to make the multi-level cells corresponding to a target address in the memory be programmed completely in a single programming loop. In addition, the complicated address inputs received by the memory are also reduced, the memory programming time is shortened, and the memory programming speed is increased.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for programming a memory comprising a plurality of multi-level cells each having a left half cell and a right half cell, the method comprising the steps of:
    providing a target address which corresponds to 2n-group data to be stored, wherein n is a positive integer; and
    programming the 2n-group data into the multi-level cells sequentially based upon the target address in a programming loop so that the data stored in the left half cells and the data stored in the right half cells are from different groups of the 2n-group data.

2. The method according to claim 1, wherein n-bit data stored in the left half cells are respectively from a first group to an nth group of the 2n-group data, and n-bit data stored in the right half cells are respectively from an (n+1)th group to a 2nth group of the 2n-group data.

3. The method according to claim 1, wherein the target address corresponds to a first bit of the 2n-group data.

4. The method according to claim 1, wherein the group of data corresponds to a page of data.

5. The method according to claim 1, further comprising the steps of:
    repeating the steps of providing the target address, and programming the 2n-group data; and
    judging whether each of the multi-level cells corresponding to the target address is programmed.

6. The method according to claim 1, further comprising the step of:
    judging whether each of the multi-level cells corresponding to the target address is programmed correctly.

7. A memory, comprising:
    a plurality of memory cell blocks, each comprising:
        a plurality of bit lines;
        a plurality of word lines; and
        a plurality of multi-level cells respectively coupled to the bit lines and the word lines, each of the multi-level cells comprising a left half cell and a right half cell, wherein:
    2n-group data to be stored is sequentially programmed into the multi-level cells based upon a target address in a programming loop so that the data stored in the left half cells and the data stored in the right half cells are from different groups of the 2n-group data, n is a positive integer.

8. The memory according to claim 7, wherein the target address corresponds to a first bit of the 2n-group data.

9. The memory according to claim 7, wherein the 2n-group data corresponds to 2n-page data.

* * * * *